United States Patent
Ishii

(10) Patent No.: US 7,710,135 B2
(45) Date of Patent: May 4, 2010

(54) METHOD FOR REGISTERING PROBE CARD AND A STORAGE MEDIUM STORING PROGRAM THEREOF

(75) Inventor: Kazunari Ishii, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 15 days.

(21) Appl. No.: 12/139,920

(22) Filed: Jun. 16, 2008

(65) Prior Publication Data
US 2008/0315904 A1    Dec. 25, 2008

(30) Foreign Application Priority Data
Jun. 22, 2007    (JP) .............................. 2007-165696

(51) Int. Cl.
  *G01R 31/02* (2006.01)
  *G01R 31/28* (2006.01)
(52) U.S. Cl. .................................. 324/758; 324/158.1
(58) Field of Classification Search ............. 324/158.1, 324/754–758; 356/400–401
See application file for complete search history.

(56) References Cited

U.S. PATENT DOCUMENTS

| | | | | |
|---|---|---|---|---|
| 4,864,227 A | * | 9/1989 | Sato | 324/758 |
| 4,918,374 A | * | 4/1990 | Stewart et al. | 324/758 |
| 5,410,259 A | * | 4/1995 | Fujihara et al. | 324/758 |
| 5,436,571 A | * | 7/1995 | Karasawa | 324/765 |
| 5,621,313 A | * | 4/1997 | Tsuta | 324/158.1 |
| 5,773,987 A | * | 6/1998 | Montoya | 324/757 |
| 5,828,225 A | * | 10/1998 | Obikane et al. | 324/758 |
| 6,906,546 B2 | * | 6/2005 | Tanioka et al. | 324/765 |
| 2003/0025517 A1 | * | 2/2003 | Kiest et al. | 324/758 |
| 2004/0140820 A1 | | 7/2004 | Sakagawa et al. | |
| 2005/0168232 A1 | | 8/2005 | Sakagawa et al. | |
| 2008/0068033 A1 | * | 3/2008 | Kagami | 324/758 |
| 2008/0198176 A1 | * | 8/2008 | Ishii et al. | 345/643 |

FOREIGN PATENT DOCUMENTS

KR    2003-0082992    10/2003

* cited by examiner

*Primary Examiner*—Ha Tran T Nguyen
*Assistant Examiner*—Joshua Benitez
(74) *Attorney, Agent, or Firm*—Oblon, Spivak, McClelland, Maier & Neustadt, L.L.P.

(57) ABSTRACT

A probe card registration method is for registering a probe card for use in inspecting electrical characteristics of a target object in a probe apparatus for performing the inspecting. The probe card registration method includes detecting a height of a load sensor provided at a mounting table for mounting thereon the target object by using a first imaging unit disposed above the mounting table; contacting the load sensor with a probe by moving the load sensor by the mounting table; and stopping the movement of the load sensor when the load sensor starts to make contact with the probe. The method further includes calculating a height of a needle of the probe based on a height of the load sensor and a stop height thereof.

5 Claims, 5 Drawing Sheets

METHOD FOR REGISTERING PROBE CARD AND A STORAGE MEDIUM STORING PROGRAM THEREOF

FIELD OF THE INVENTION

The present invention relates to a registration method of a probe card for use in inspecting electrical characteristics of a target object in a probe apparatus performing the inspection thereon; and, more particularly, to a registration method of a probe card that can prevent the probe card from being damaged when the probe card is registered and a program storage medium for recording a program of the method.

BACKGROUND OF THE INVENTION

In general, a probe apparatus includes a mounting table for mounting thereon a target object such as a semiconductor wafer or the like, a probe card disposed above the mounting table, and an alignment mechanism for aligning probes of the probe card and electrode pads of the target object placed on the mounting table. The electrical characteristics of the target object are inspected after the target object and the probes are aligned by the alignment mechanism. The alignment mechanism has a first camera attached to an alignment bridge and a second camera attached to the mounting table. The alignment of the target object and the probe card is carried out by detecting the electrode pads or the like of the target object with the first camera and detecting the probes with the second camera.

Therefore, when a new probe card is to be used, the new probe card needs to be registered in a probe apparatus. In order to register the new probe card, there arises a need to input data on a needle height of a probe which can be obtained when the probe card is installed in the probe apparatus (a distance from the origin to the probe needle), and the second camera moves to a position directly under the probe by the mounting table to find the probe. Next, the second camera is moved up from that position and detects the needle height of the probe. The needle height of the probe is calculated based on the rising distance of the second camera.

When the data on the needle height of the probe is inputted, the needle height of the probe when the probe card is installed in the probe apparatus needs to be estimated based on a design value of the probe card in order to determine an initial position of a mounting table in starting a registration process. After the data on the needle height of the probe is inputted, a mounting table 1 is moved up from the initial position in accordance with the input value and stops at the position, as shown in FIG. 6A.

Thereafter, an operator moves the mounting table 1 through a MMI (man machine interface) (not shown) such that a tip of a probe 3A of a probe card 3 is positioned at a central portion in the screen of the second camera 2 while being focused. The X, Y and Z coordinates of the probe 3A at this time are registered in the probe apparatus as probe registration coordinates. At this time, the movement of the mounting table 1 is restricted so that the mounting table 1 does not contact with the probe card 3, as indicated by a dashed dotted line shown in FIG. 6A. As a result, the probe card can be prevented from being damaged by an excessive rising of the mounting table 1.

However, if there is an error in the input data of the needle height of the probe 3A, it is difficult for the second camera to detect the specific probe. Further, even when the mounting table 1 is moved up from the initial position within the movement restriction, the mounting table 1 may contact with the probe 3A of the probe card 3 and damage the probe card 3, as shown in FIG. 6B, if an initial height of the mounting table 1 is set higher than that of the original position.

SUMMARY OF THE INVENTION

In view of the above, the present invention provides a probe card registration method that can precisely and stably register a probe card without inputting a needle height of a probe and damaging the probe card, and a storage medium for a program of the method.

In accordance with an aspect of the present invention, there is provided a probe card registration method for registering a probe card for use in inspecting electrical characteristics of a target object in a probe apparatus for performing the inspecting, the method including: detecting a height of a load sensor provided at a mounting table for mounting thereon the target object by using a first imaging unit disposed above the mounting table; contacting the load sensor with a probe of the probe card by moving the load sensor by the mounting table; and stopping the movement of the load sensor when the load sensor starts to make contact with the probes. The method further includes calculating a height of a needle of the probes based on a height of the load sensor and a stop height thereof.

The above method may further include obtaining a horizontal position of the needle of the probe of the probe card by using a second imaging unit provided at the mounting table.

The above method may further include, prior to the detecting step, checking whether the load sensor operates normally by contacting a pin with the load sensor.

A height of the pin may be detected by using the second imaging unit.

In accordance with another aspect of the present invention, there is provided a storage medium storing a program of a registration method of a probe card for use in inspecting electrical characteristics of a target object in a probe apparatus for performing the inspecting, wherein the above-described registration method of the probe card is executed by operating a computer based on the program.

In accordance with the aspects of the present invention, there are provided a probe card registration method which can precisely and stably register a probe card without inputting data on a needle height of a probe and damaging the probe card, and a storage medium for a program of the method.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

The embodiments of the present invention will show described with reference to FIGS. 1 to 5C which form a part hereof. However, the present invention is not limited thereto.

First of all, a probe apparatus to which a probe card registration method in accordance with the embodiment of the present invention is applied will be explained with reference to FIGS. 1 to 3.

Figure 1:
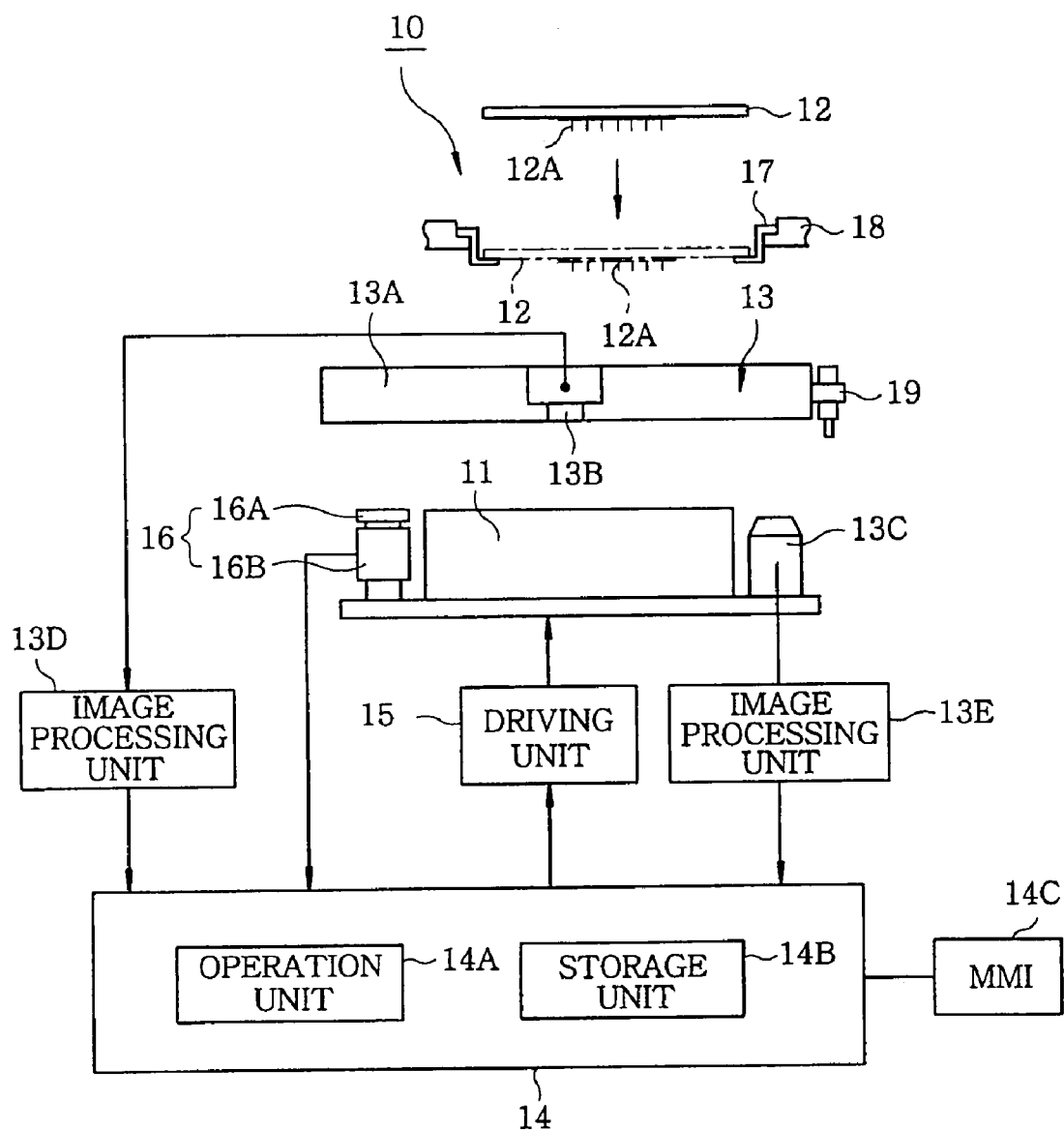
FIG. 1 shows a schematic diagram of a probe apparatus in accordance with an embodiment the present invention.

As shown in FIG. 1, the probe apparatus 10 includes a movable mounting table 11 for mounting thereon a wafer (not shown) serving as a target object; a probe card 12 disposed above the mounting table 11; an alignment mechanism 13 for aligning the wafer mounted on the mounting table 11 with a plurality of probes 12A of the probe card 12; and a controller 14 mainly having a computer for controlling various components including the mounting table 11 and the alignment mechanism 13. The alignment mechanism 13 is driven under the control of the controller 14 to thereby align the wafer mounted on the mounting table 11 with the probes 12A of the probe card 12. Next, the probes 12A are brought into electrical contact with the wafer, so that the electrical characteristics of the wafer are inspected. The probe card 12 may be a conventional probe card or a novel probe card, and is newly installed at a position indicated by a dashed dotted line in FIG. 1.

The mounting table 11 is constructed to move in X, Y, Z and θ directions via a driving mechanism 15 operating under the control of the controller 14. Provided at a side of the mounting table 11 is a load sensor 16 for used in registering the probe card 12 in accordance with the embodiment of the present invention. When a new probe card 12 is installed in the probe apparatus 10 as will be described later, the load sensor 16 detects a needle height of the probe 12A of the probe card 12. Further, the load sensor 16 detects a needle height of the probe 12A by a load obtained when the load sensor 16 contacts with the probe 12A via the alignment mechanism 13. The probe card 12 is attached to a head plate 18 of a probe chamber via a card holder 17.

The alignment mechanism 13 includes an alignment bridge 13A horizontally moving between a rear surface of the probe chamber and a probe center; a first imaging unit (e.g., CCD camera) 13B provided at the alignment bridge 13A; and a second imaging unit (e.g., CCD camera) 13C provided at a side of the mounting table 11. The alignment mechanism 13 aligns the registered probe card 12 with the wafer mounted on the mounting table 11. The first CCD camera 13B moves from the rear surface of the probe chamber to the probe center via the alignment bridge 13A, and then is positioned between the probe card 12 and the mounting table 11.

In that position, the first CCD camera 13B detects and images electrodes of the wafer from above while the mounting table 11 is moving in X and Y directions. The images thus obtained are processed in an image processing unit 13D, and then are transmitted to the controller 14 as image signals.

After the alignment bridge 13A retreats to the rear surface of the probe chamber, the second CCD camera 13C sequentially detects and images the probes 12A from below the probe card 12 while the mounting table 11 is moving in X and Y directions below the probe card 12. The images thus obtained are processed in an image processing unit 13E, and then are transmitted to the controller 14 as image signals. Besides, a pin 19 having a spring is attached to the alignment bridge 13A. When the pin 19 contacts with the load sensor 16, a predetermined load (e.g., 30 gf±10%) is applied, thereby checking whether the load sensor 16 operates normally or not.

As illustrated in FIG. 1, the load sensor 16 provided at the mounting table 11 includes a circular sensor unit 16A accommodating therein a load sensor for detecting a predetermined load and a cylinder mechanism 16B for moving up and down the sensor unit 16A. The sensor unit 16A is moved up and down between a position lower than a mounting surface of the mounting table 11 and a position higher than the mounting surface by about 4 to 5 mm. When the sensor unit 16A is located at the position higher than the mounting surface by about 4 to 5 mm, a leading end of the pin 19 or those of the probes 12A are detected. The load sensor 16 includes a touch sensor of high sensitivity (±50 μm).

Figure 2:
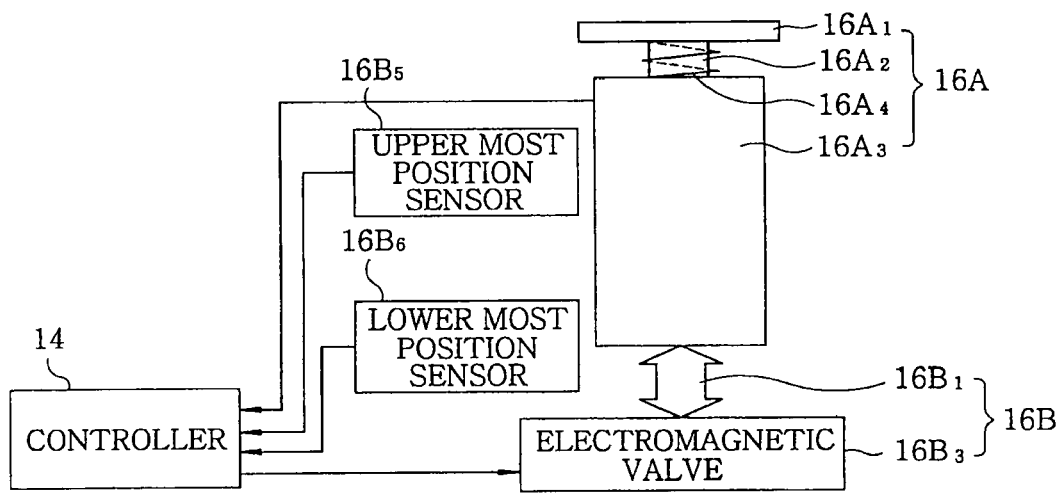
FIG. 2 describes a schematic diagram of a load sensor in FIG. 1.

As depicted in FIG. 2, the sensor unit 16A includes a circular sensor plate $16A_1$; a rod $16A_2$ extending from a central portion of a bottom of the sensor plate $16A_1$; a cylindrical main body $16A_3$ accommodating therein a sensor main body and having on its top surface a through hole through which a lower portion of the rod $16A_2$ penetrates; and a spring $16A_4$ attached between the top surface of the main body $16A_3$ and the sensor plate $16A_1$. When a load is applied to the sensor plate $16A_1$, the sensor plate $16A_1$ is elastically moved down via the spring $16A_4$ on the top surface of the main body $16A_3$. The sensor main body reacts to a predetermined load (e.g., 30 gf±10%), and the load sensor 16 operates.

Figure 3:
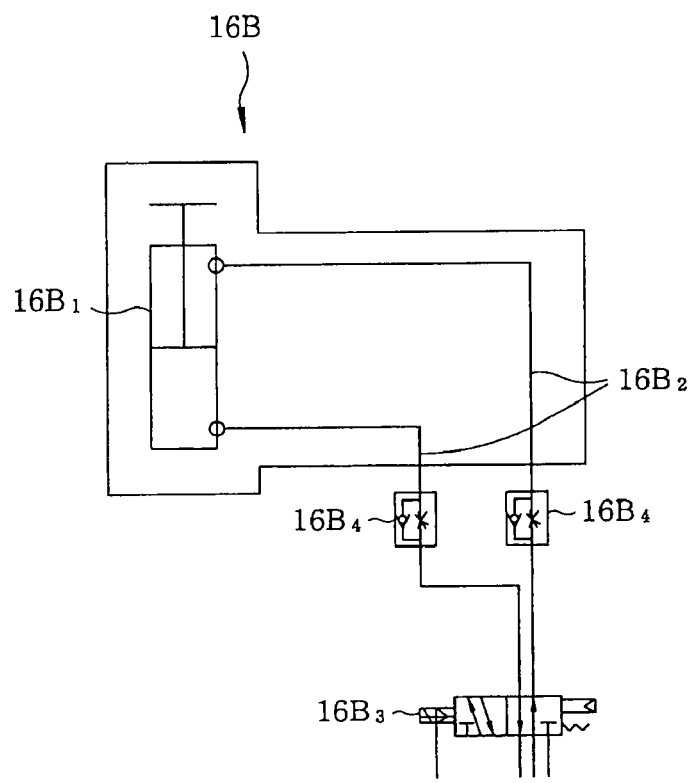
FIG. 3 provides a block diagram of a pneumatic control circuit of a cylinder mechanism of the load sensor in FIG. 1.

As can be seen from FIG. 3, the cylinder mechanism 16B includes an air cylinder $16B_1$, an electromagnetic valve $16B_3$ connected to the air cylinder $16B_1$ via air lines $16B_2$, two flow rate control valves $16B_4$ attached to the air lines $16B_2$ between the air cylinder $16B_1$ and the electromagnetic valve $16B_3$ and an uppermost and a lowermost position sensor $16B_5$ and $16B_6$ for detecting positions of uppermost and lowermost end portions of the air cylinder $16B_1$ (see FIG. 2). The electromagnetic valve $16B_3$ switches an input and an output port of compressed air to the air cylinder $16B_1$ under the control of the controller 14, thereby moving the sensor unit 16A up and down. When the sensor unit 16A reaches the uppermost and the lowermost end position, the uppermost and the lowermost position sensor $16B_5$ and $16B_6$ operate at the respective positions, and the electromagnetic valve $16B_3$ is stopped by the controller 14.

As illustrated in FIG. 1, the controller 14 has an operation unit 14A and a storage unit 14B. When the probe card registration method of the present invention is implemented, the operation unit 14A performs various operations by sending and receiving various signals to and from the components of the probe apparatus 10, and the storage unit 14B stores therein various data information of operation results and the like. The storage unit 14B is provided with a main storage unit and an auxiliary storage unit. The auxiliary storage unit stores therein various programs including the program of the probe card registration method of the present invention.

Hereinafter, an embodiment of the probe card registration method of the present invention will be described with reference to FIGS. 4A to 5C.

The probe card registration method in accordance with the embodiment of the present invention is performed, e.g., when a new probe card 12 is installed in the probe apparatus 10 based on the program stored in the storage unit 14B of the controller 14. In case of installing the new probe card 12 in the probe apparatus 10 according to the conventional method, a needle height of the probe 12A needs to be inputted by an operator based on a design value of the new probe card 12. In this embodiment, however, the probe card registration method is performed by the controller 14.

That is, in this embodiment, the new probe card 12 is installed at a central opening of the head plate 18 of the probe apparatus 10 via the card holder 17, as indicated by a dashed dotted line in FIG. 1. After the probe card 12 is installed, the probe card registration method is performed by the controller 14.

Figure 4A:
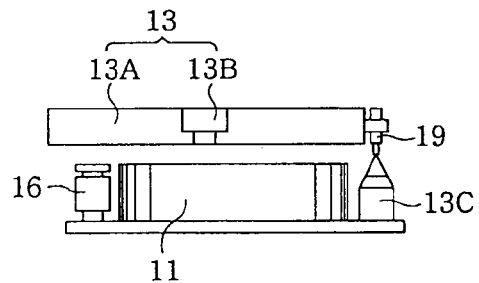
FIGS. 4A to 4D schematically present sequential processes of a probe card registration method in accordance with the embodiment of the present invention.

When the probe card registration method is carried out, the alignment bridge 13A of the alignment mechanism 13 moves to the probe center, as illustrated in FIG. 4A. At the same time, the mounting table 11 moves, and the pin 19 installed at the alignment bridge 13A is searched by the second CCD camera 13C. Since the position of the pin 19 is already known, the pin 19 can be easily detected by the second CCD camera 13C. When the pin 19 is captured in the view of the second CCD camera 13C, the mounting table 11 is stopped and gradually moved up from that position. When the second CCD camera 13C focuses on a leading end surface of the pin 19, the leading end of the pin 19 is detected.

The controller 14 detects the height of the mounting table 11 at that moment, and the detected height is registered in the storage unit 14B. The focal lengths of the first and the second CCD camera 13B and 13C are registered in the storage unit 14B in advance. Therefore, a needle height of the pin 19 can be calculated by the operation unit 14A based on the height of the mounting table 11 and the focal length of the second CCD camera 13C, and the calculated height and X and Y coordinates at that movement are registered in the storage unit 14B.

In the load sensor 16, the electromagnetic valve $16B_3$ is driven, based on the signal from the controller 14, to operate the cylinder mechanism 16B and then to operate the sensor unit 16A. When the top surface of the sensor plate $16A_1$ of the sensor unit 16A reaches the position higher than the mounting surface of the mounting table 11, i.e., the uppermost end position, the electromagnetic valve $16B_3$ is driven based on the signal from the uppermost position sensor $16B_5$ to stop the supply of the compressed air and, then, the sensor plate $16A_1$ is fixed to the uppermost end position.

Figure 4B:
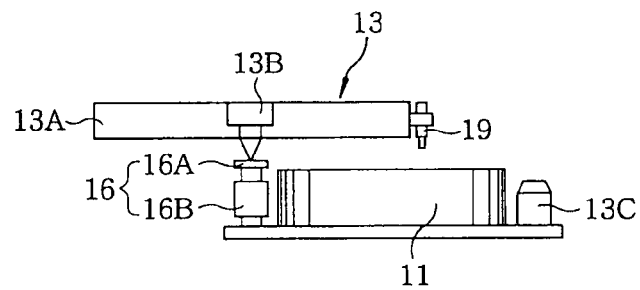

At the same time, the mounting table 11 moves, and the load sensor 16 installed at the mounting table 11 is searched by the first CCD camera 13B of the alignment bridge 13A during the movement of the mounting table 11. When the load sensor 16 is captured in the view of the first CCD camera 13B, the mounting table 11 stops. At that position, the first CCD camera 13B detects the load sensor 16 by focusing on the top surface of the sensor unit 16A of the load sensor 16 as shown in FIG. 4B. The controller 14 recognizes the height of the mounting table 11 at that movement as the height of the load sensor 16, and the height and X and Y coordinates at that movement are registered in the storage unit 14B.

Figure 4C:
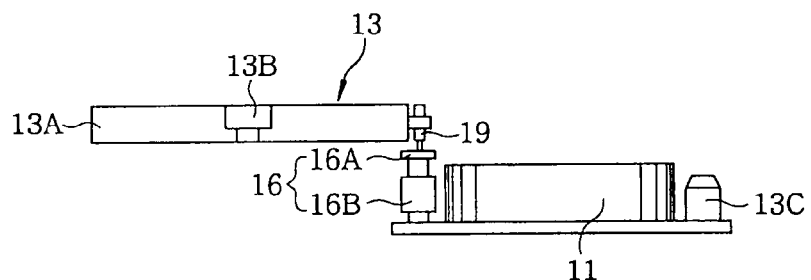

Thereafter, the load sensor 16 moves by the mounting table 11 and stops at a position directly under the pin 19. In that state, the load sensor 16 is moved up by the mounting table 11 and is brought into contact with the pin 19 so that a predetermined load is applied to the load sensor 16, as shown in FIG. 4C. At this time, the sensor unit 16A is moved down into the main body $16A_3$ against elasticity of the spring $16A_4$, whereby the sensor switch operates to send a signal to the controller 14 to stop the mounting table 11. In this manner, it is possible to check that the load sensor 16 operates normally.

Figure 4D:
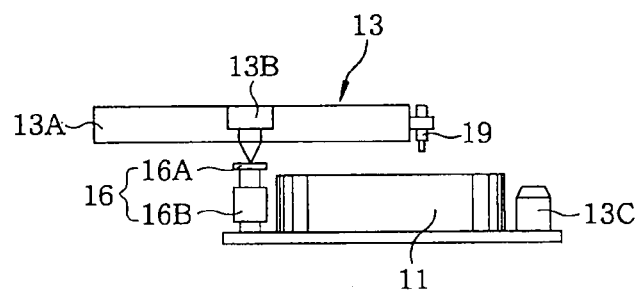

After the operation of the load sensor 16 is checked, the load sensor 16 moves by the mounting table 11, as described in FIG. 4D. Then, the load sensor 16 is detected by the first CCD camera 13B, and it is checked that the height of the load sensor 16 is the same as the initially detected height. After the normal operation of the load sensor 16 is checked as described above, a needle height of the probe 12A of the new probe card 12 is detected by using the load sensor 16.

Figure 5A:
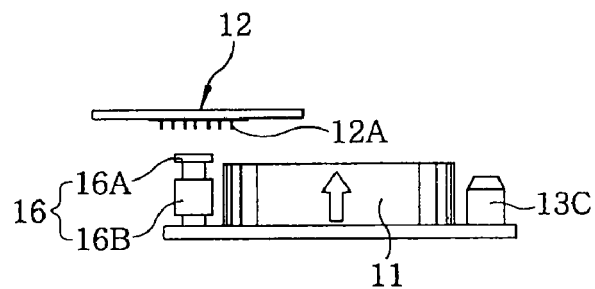
FIGS. 5A and 5C schematically show sequential processes continued from the processes of FIG. 4A to 4D.
Figure 5B:
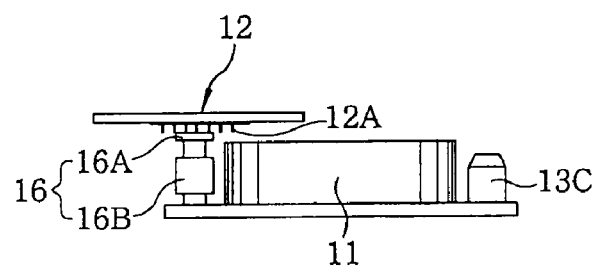

In order to detect the needle height of the probe 12A by using the load sensor 16, the alignment bridge 13A retreats from the probe center shown in FIG. 4D under the control of the controller 14 and, also, the mounting table 11 moves horizontally so that the load sensor 16 is positioned directly under the probe card 12, as illustrated in FIG. 5A. Next, as indicated by an arrow in FIG. 5A, the load sensor 16 is gradually moved up by the mounting table 11 by, e.g., about 20 μm at a time, thereby detecting the needle of the probe 12A. When the load sensor 16 is gradually moved up by about 20 μm at a time to thereby be brought into contact with the needle of the probe 12A as depicted in FIG. 5B, the load sensor 16 begins to respond to the probe 12A and a detection signal is transmitted to the controller 14.

Then, the controller 14 stops the mounting table 11 based on the detection signal. In the controller 14, the needle height of the probe 12A is calculated based on the height of the mounting table 11 at that moment and the height of the load sensor 16 which was detected by the first CCD camera 13B, and the calculated needle height is stored in the storage unit 14B of the controller 14.

Figure 5C:
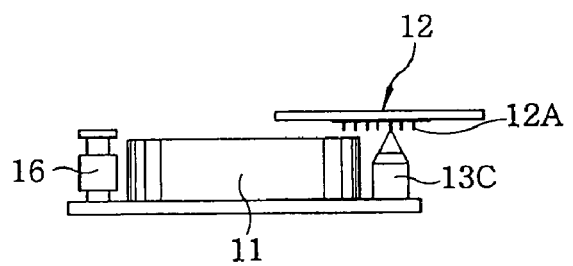
Figure 6A:
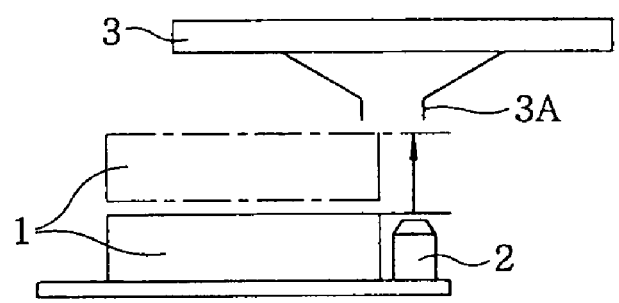
FIGS. 6A and 6B illustrate schematic diagrams of an example of a conventional alignment method.
Figure 6B:
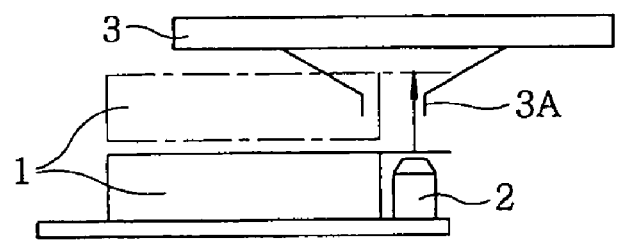

Thereafter, the second CCD camera 13C moves by the mounting table 11 to a position directly under the probe card 12 and stops at that position, as shown in FIG. 5C. Then, an operator moves the mounting table 11 through a MMI 14C in a horizontal direction such that a target probe 12A (e.g., the probe at an outermost corner of the probe card 12) to be registered is positioned at a central portion in the screen of the second CCD camera 13C. At this time, since focusing of the second CCD camera 13C is already made, a probe tip of the target probe 12A can be readily positioned at the central portion in the screen of the second CCD camera 13C without adjusting the height thereof. By registering X and Y coordinates of the tip of the probe 12A in the storage unit 14B of the controller 14, the registration of the probe card 12 is completed.

Even when it is difficult to detect the needles of the probes 12A by the second CCD camera 13C, the height of the needle of the probe 12A is precisely recognized by the load sensor 16 in the controller 14, so that the positions of the needles of the probes 12A (horizontal positions and height) can be detected with high accuracy by the second CCD camera 13C.

As set forth above, in accordance with the embodiment of the present invention, the method for registering the probe card 12 in the probe apparatus 10 includes: detecting a height of the load sensor 16 provided at the mounting table 11 by using the first CCD camera 13B disposed above the mounting table 11; making the load sensor 16 contact with the probes 12A by moving the load sensor 16 by the mounting table 11; stopping the load sensor 16 when the load sensor 16 contacts with the probes 12A; and calculating a needle height of the probe 12A based on the height of the load sensor 16 and the stop height thereof. In this method, the needle height of the probe 12A can be directly detected by the load sensor 16. Therefore, it is not required as in the prior art to input data based on the design value of the probe card 12. As a result, the probe card 12 can be prevented from being damaged due to an input error in the needle height. In accordance with this embodiment, even when design data of the probe card 12 is not provided because the probe card 12 is new, the needle height of the probe 12A can be precisely detected without inflicting damages on the probe card 12.

Further, in accordance with the embodiment of the present invention, even when a needle height varies depending on manufacturers of the probe card 12 for inspecting the same kind of wafer, or when a probe card different from the original probe card is installed, it is possible to detect the needle height of the probe 12A, and also possible to register the probe card 12 with high precision.

Moreover, in accordance with the embodiment of the present invention, there is provided a step of calculating horizontal positions of the needles of the probes 12A of the probe card 12 by using the second CCD camera 13C provided at the mounting table 11, so that the needle positions of the probes 12A can be quickly detected during the alignment process performed prior to the inspection process.

Further, in accordance with the embodiment of the present invention, after the height of the load sensor 16 is detected, the operation of the load sensor 16 is checked by using the pin 19 before the needle height of the probe 12A is detected. Therefore, the needle height of the probe 12A can be precisely detected in a state where the load sensor 16 operates normally. The height of the pin 19 is detected by using the second CCD camera 13C before the height of the load sensor 16 is detected, so that the load sensor 16 can be brought into contact with the pin 19 by a predetermined load. Besides, since the height of the load sensor 16 is detected again after the operation of the load sensor 16 is checked by using the pin 19, the needle height of the probe 12A can be detected with high precision.

In accordance with embodiment of the present invention, the probe card registration method is recorded in a storage medium and thus can be simply applied to a plurality of probe apparatuses 10. Accordingly, the probe card 12 can be simply registered in any probe apparatus 10.

The present invention is not limited to the above embodiments, and each of the components can be appropriately modified when necessary. For example, although an elastically operating load sensor is described in the above embodiment, the load sensor may not operate elastically.

The present invention can be appropriately used for a probe apparatus for inspecting electrical characteristics of a target object such as a semiconductor wafer or the like.

While the invention has been shown and described with respect to the embodiments, it will be understood by those skilled in the art that various changes and modification may be made without departing from the scope of the invention as defined in the following claims.

What is claimed is:

1. A probe card registration method for registering a probe card for use in inspecting electrical characteristics of a target object in a probe apparatus for performing the inspecting, comprising:

detecting a height of a load sensor provided at a mounting table for mounting thereon the target object by using a first imaging unit disposed above the mounting table;

contacting the load sensor with a probe of the probe card by moving the load sensor by the mounting table;

stopping the movement of the load sensor when the load sensor starts to make contact with the probe; and calculating a height of a needle of the probe based on a height of the load sensor and a stop height thereof.

2. The probe card registration method of claim 1, further comprising: obtaining a horizontal position of the needle of the probe of the probe card by using a second imaging unit provided at the mounting table.

3. The probe card registration method of claim 1, further comprising, prior to the detecting step, checking whether the load sensor operates normally by contacting a pin with the load sensor.

4. The probe card registration method of claim 3, wherein a height of the pin is detected by using the second imaging unit.

5. A program storage medium storing a program of a registration method of a probe card for use in inspecting electrical characteristics of a target object in a probe apparatus for performing the inspecting, wherein the registration method of the probe card described in claim 1 is executed by operating a computer based on the program.

* * * * *